United States Patent [19]

Brown

[11] Patent Number: 5,185,581

[45] Date of Patent: Feb. 9, 1993

[54] DIFFERENTIAL AMPLIFIER AND HIGH FREQUENCY RESONANT CIRCUITS CONSTRUCTED THEREFROM

[75] Inventor: Anthony K. D. Brown, Kanata, Canada

[73] Assignee: Northern Telecom Limited, Montreal, Canada

[21] Appl. No.: 858,269

[22] Filed: Mar. 26, 1992

[51] Int. Cl.⁵ .............................................. H03F 3/45
[52] U.S. Cl. ................................... 330/254; 330/306; 331/108 B; 331/57
[58] Field of Search .................. 330/254, 306; 331/57, 331/108 B, 135-137

[56] References Cited

U.S. PATENT DOCUMENTS 4,516,081  5/1985  Katakura .............................. 330/254
5,093,634  3/1992  Khoury ............................. 331/108 B

FOREIGN PATENT DOCUMENTS 3522416  1/1987  Fed. Rep. of Germany ...... 330/254

OTHER PUBLICATIONS

"Phase Noise in Signal Sources" (Theory and Applications), W. P. Robins, IEE Telecommunications Series 9, pp. 47-53, (Peter Peregrinus Ltd., 1982).

Primary Examiner—James B. Mullins
Attorney, Agent, or Firm—C. W. Junkin

[57] ABSTRACT

A differential amplifier includes a bias current source and a current dividing circuit for controllably dividing a bias current between first and second current paths. A first pair of matched transistors is connected as a differential pair between matched load impedances and the first current path. A second pair of matched transistors is connected as a differential pair between the matched load impedances and the second current path. Differential inputs of the second differential pair are connected to corresponding differential inputs of the second differential pair. The transistors of the first and second pairs have different emitter areas. Matched capacitors may be connected between respective differential inputs and differential outputs of the differential amplifier. The load impedances may be tapped to provide outputs having a lower differential gain. The differential amplifier is useful for building resonant circuits, for example voltage controlled oscillators having high Q factors.

15 Claims, 6 Drawing Sheets

DIFFERENTIAL AMPLIFIER AND HIGH FREQUENCY RESONANT CIRCUITS CONSTRUCTED THEREFROM

RELATED APPLICATIONS

Some of the subject matter disclosed in this application is the subject of copending application Ser. No. 857,909 filed Mar. 26, 1992 in the name of A. K. D. Brown entitled "Resonant Circuit and Multiple Resonator Circuits Constructed Therefrom".

FIELD OF THE INVENTION

This invention relates to differential amplifiers and to high frequency resonant circuits constructed from such differential amplifiers for use in oscillators, filters and the like.

BACKGROUND OF THE INVENTION

A well known differential amplifier comprises a matched pair of bipolar transistors, a matched pair of load impedances and a current source. Each load impedance is connected between a voltage supply and a collector of a respective one of the transistors, and emitters of both transistors are connected to the current source. Differential inputs are applied to bases of the transistors, and differential outputs are taken from the collectors of the transistors.

Two such differential amplifiers can be cross-coupled to construct a quadrature phase Voltage Controlled Oscillator (VCO) which oscillates with 90 degree phase shift across each differential amplifier and with 180 degree phase shift in the cross-coupled feedback loop.

Unfortunately, typical manufacturing process variations affect the oscillation frequency of such VCOs, so that such VCOs must be tuned after manufacture if oscillation at a particular oscillation frequency is required. W. P. Robins proposes tuning by means of varactor diodes which might be coupled between the collectors of the matched transistors in each differential amplifier (see Phase Noise in Signal Sources (Theory and Applications), Peter Peregrinus Ltd). Unfortunately, this method requires pretrimming of the load impedances to center the oscillation frequency because the tuning range achievable with varactor diodes alone cannot cope with circuit parameter variations which result from typical manufacturing process variations. Moreover, the resulting VCO typically has a fairly low quality factor (Q) due to nonlinearities in the circuit parameters.

SUMMARY OF THE INVENTION

This invention provides a differential amplifier which overcomes or reduces some of the limitations of known differential amplifiers when used in high frequency resonant circuits, such as voltage controlled oscillators.

More particularly, this invention provides a differential amplifier which can be used to construct voltage controlled oscillators and other high frequency resonant circuits while providing a tuning range which is sufficient to cope with circuit parameter variations which result from typical manufacturing process variations.

One aspect of the invention provides a differential amplifier which comprises a current source, a current dividing circuit, a pair of matched load impedances, and first and second pairs of matched transistors. The current dividing circuit controllably divides a substantially constant bias current provided by the current source between first and second current paths. The first pair of matched transistors is connected as a differential pair between the matched load impedances and the first current path. The second pair of matched transistors is connected as a differential pair between the matched load impedances and the second current path with differential inputs of the second differential pair connected to corresponding differential inputs of the first differential pair. Each transistor of the first pair has a first emitter area, and each transistor of the second pair has a second emitter area different from the first emitter area.

In the differential amplifier according to one aspect of the invention, the single matched transistor pair of known differential amplifiers is split into two matched transistor pairs connected in parallel, the two transistor pairs having different emitter areas. The frequency response of the differential amplifier is tuned by controlling the division of bias current between the two matched transistor pairs as explained below. Making the first emitter area approximately five times the second emitter area provides a tuning range of approximately one octave, which is sufficient to cope with most circuit parameter variations induced by manufacturing process tolerances.

An embodiment of the differential amplifier may comprise first and second matched load impedances; first, second and third pairs of matched bipolar transistors; and a current source. The first and second matched impedances are connected between a voltage supply and first and second output terminals respectively. A first transistor of the first matched pair has a collector connected to the first output terminal, a base connected to a first input terminal and an emitter connected to a first node. A second transistor of the first matched pair has a collector connected to the second output terminal, a base connected to a second input terminal and an emitter connected to the first node. A first transistor of the second matched pair has a collector connected to the first output terminal, a base connected to the first input terminal and an emitter connected to a second node. A second transistor of the second matched pair has a collector connected to the second input terminal, a base connected to the second input terminal and an emitter connected to the second node. A first transistor of the third matched pair has a collector connected to the first node, a base connected to a first control input and an emitter connected to a third node, and a second transistor of the third matched pair has a collector connected to the second node, a base connected to a second control input and an emitter connected to the third node. The transistors of the second matched pair have an emitter area different from the emitter area of the transistors of the first matched pair. The current source supplies a substantially constant current at the third node, and that current is divided between the first and second transistors of the third pair according to a voltage applied between the first and second control inputs.

The differential amplifier may further comprise a pair of matched capacitors, each capacitor connected between a respective differential input and a respective differential output of the differential amplifier. Such capacitors increase the quality factor of resonant circuits constructed from pairs of the differential amplifiers as defined below.

The load impedances of the differential amplifier may be tapped to provide tap outputs having lower differential gain. Such tap outputs are useful in multiple resonator circuits constructed from multiple pairs of the differential amplifiers as defined below.

Another aspect of the invention provides a resonant circuit comprising first and second differential amplifiers as defined above. A positive input of the second differential amplifier is connected to a positive output of the first differential amplifier, a negative input of the second differential amplifier is connected to a negative output of the first differential amplifier, a positive input of the first differential amplifier is connected to a negative output of the second differential amplifier, and a negative input of the first differential amplifier is connected to a positive output of the second differential amplifier to complete the resonant circuit.

The resonant circuit may have a loop gain greater than unity for operation as a voltage controlled oscillator, or may have a loop gain less than unity for use in a tuned filter.

Yet another aspect of the invention provides multiple resonator circuits comprising a plurality of resonant circuits as defined above. In the multiple resonator circuits, the resonant circuits may be connected in series, each resonant circuit having a loop gain less than unity for operation of the multiple resonator circuit as part of a tuned filter.

Alternatively, the resonant circuits may be connected in a ring, the multiple resonator circuit having a ring gain greater than unity and a 90 degree phase shift across each resonant circuit at a particular frequency for oscillation at that frequency. Advantageously, the ring gain may dominate loop gains of the resonant circuits comprising the multiple resonator circuit so as to enhance a quality factor of the multiple resonator circuit.

BRIEF DESCRIPTION OF ACCOMPANYING DRAWINGS

Embodiments of the invention are described below by way of example only. Reference is made to accompanying drawings, in which.

Figure 3A:
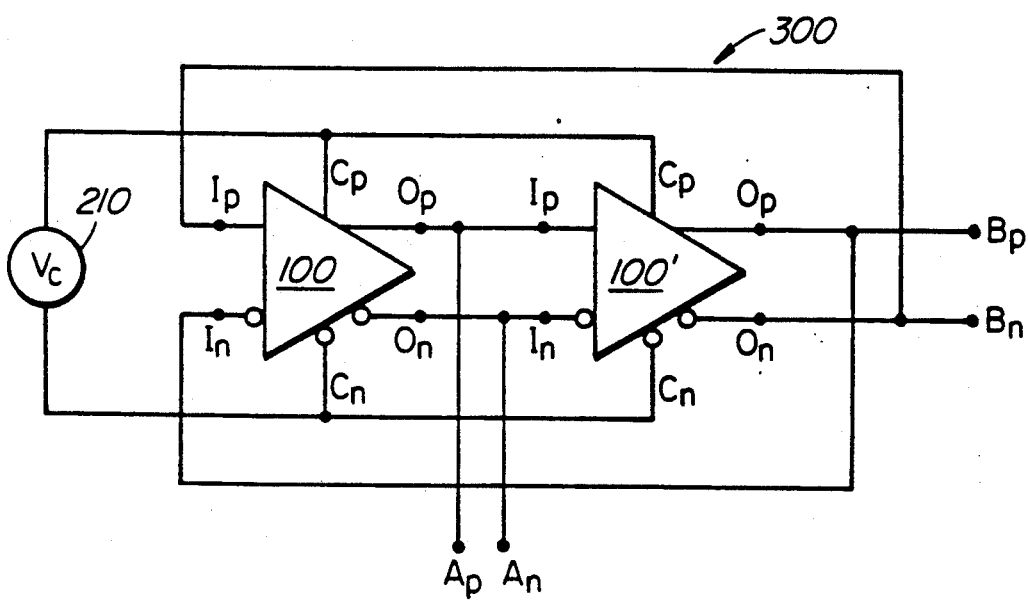
FIG. 3A is a schematic diagram of two differential amplifiers as shown in FIGS. 1A and 1B connected as a differential two port bidirectional resonator.
Figure 6A:
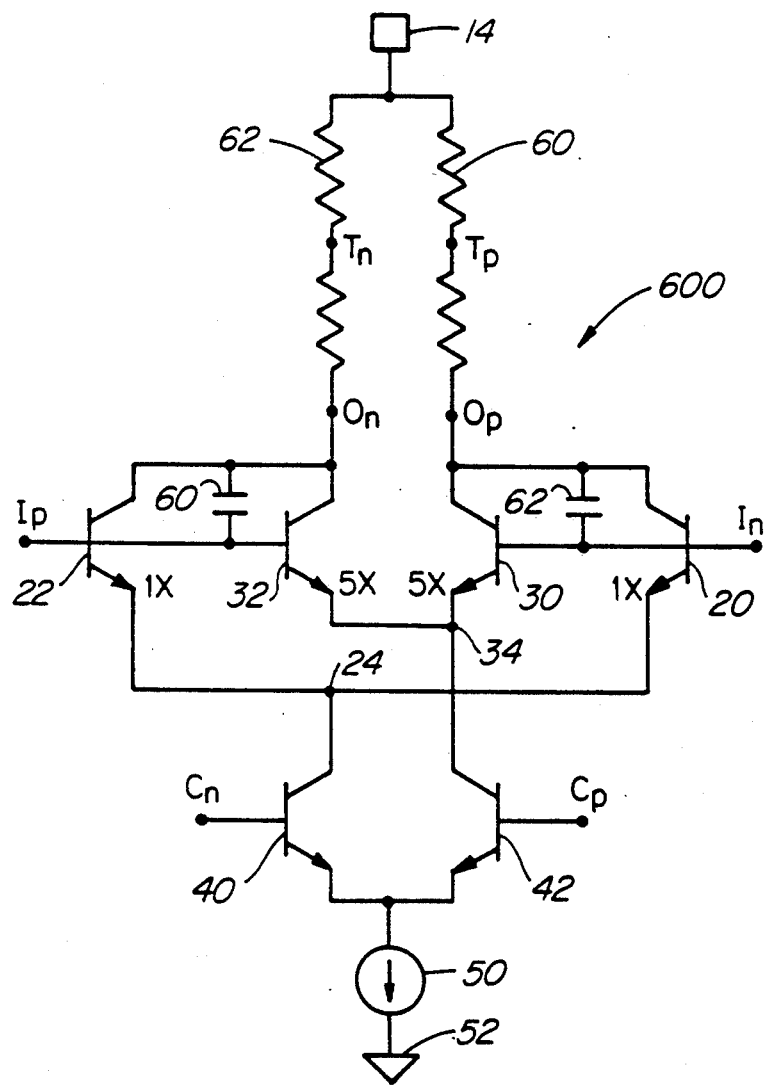
FIG. 6A is a circuit diagram of a differential amplifier according to a second embodiment of the invention.
Figure 6B:
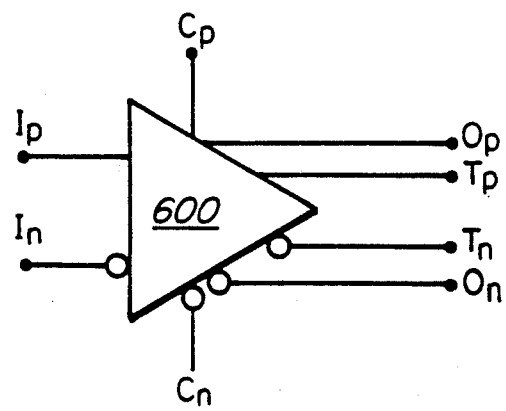
FIG. 6B illustrates a symbol used to denote the differential amplifier of FIG. 6A.
Figure 7:
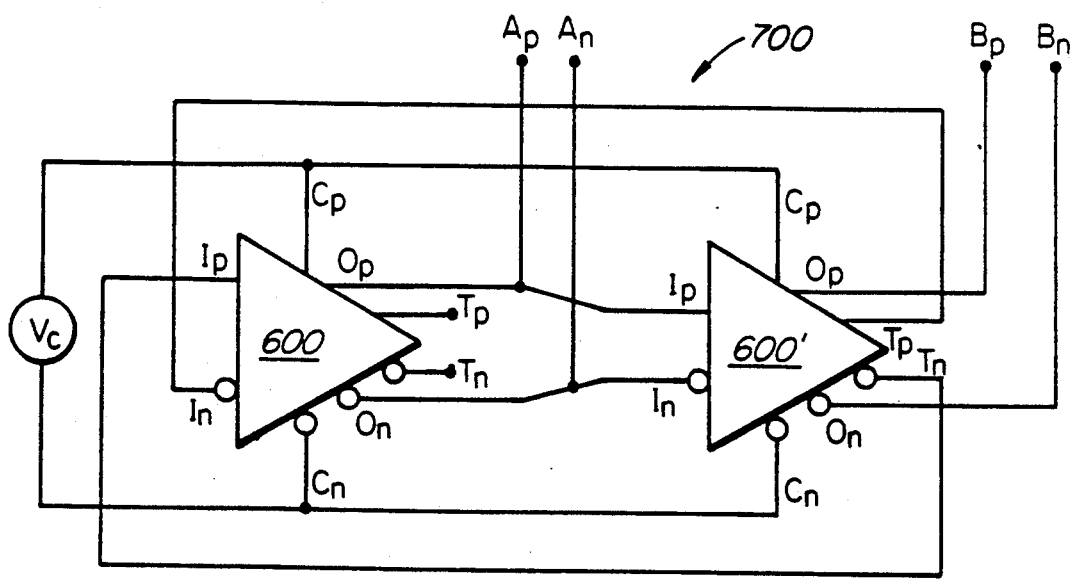
Figure 8:
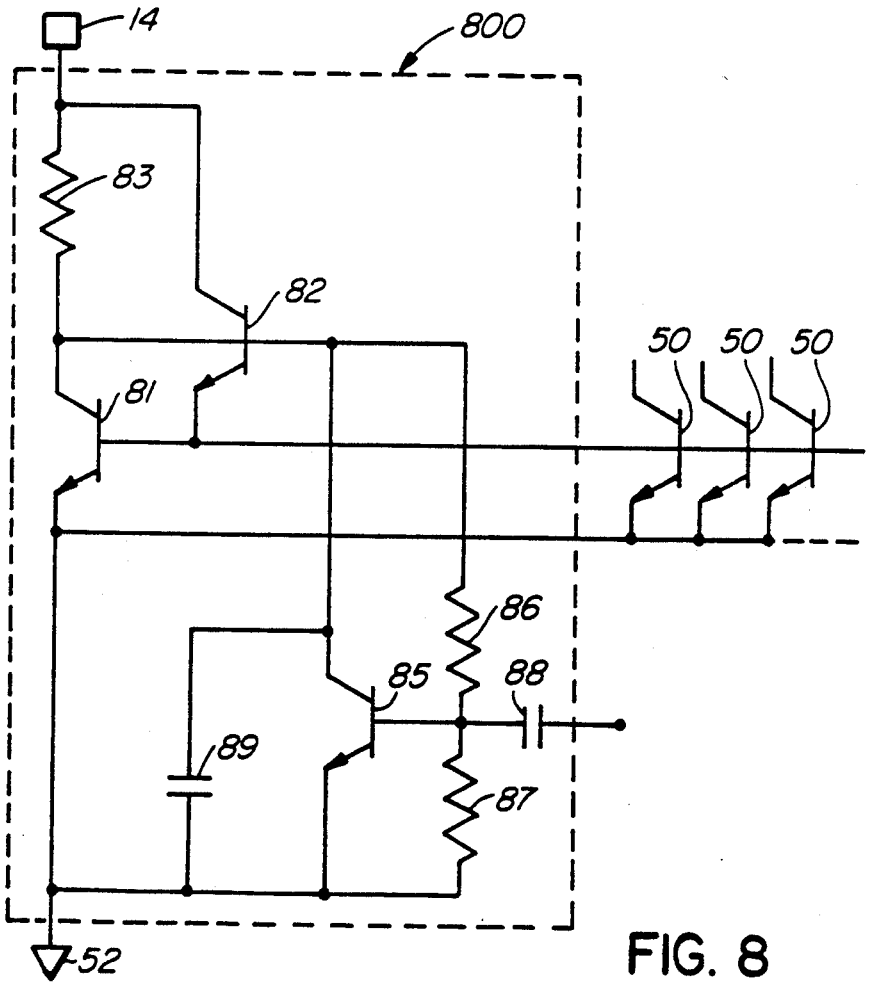
Figure 9:
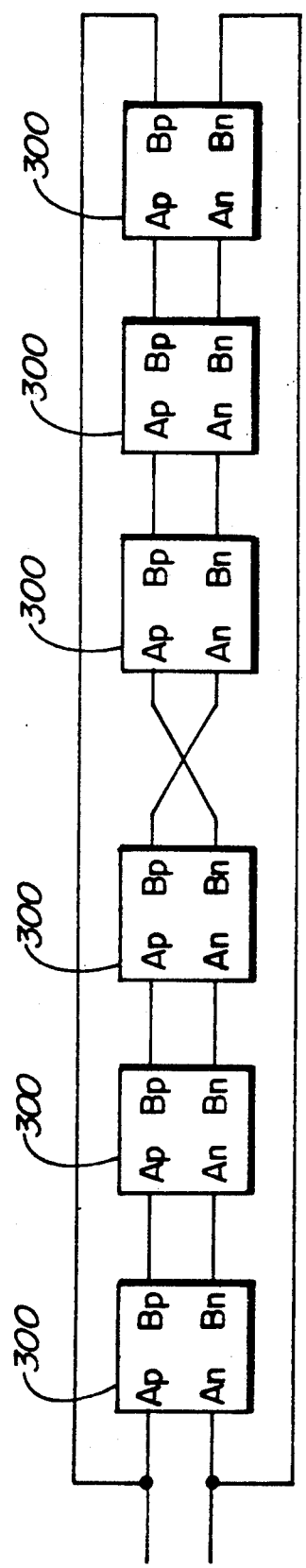

FIG. 7 is a schematic diagram of two differential amplifiers as shown in FIGS. 6A and 6B connected as a differential two port resonator having unequal bidirectional gain; and FIG. 8 is a circuit diagram of a peak detector and bias control circuit for used in the two port resonator of FIG. 3A; and FIG. 9 is a schematic diagram of six resonators connected in a ring to act as a voltage controlled oscillator.

DESCRIPTION OF EMBODIMENTS

Figure 1A:
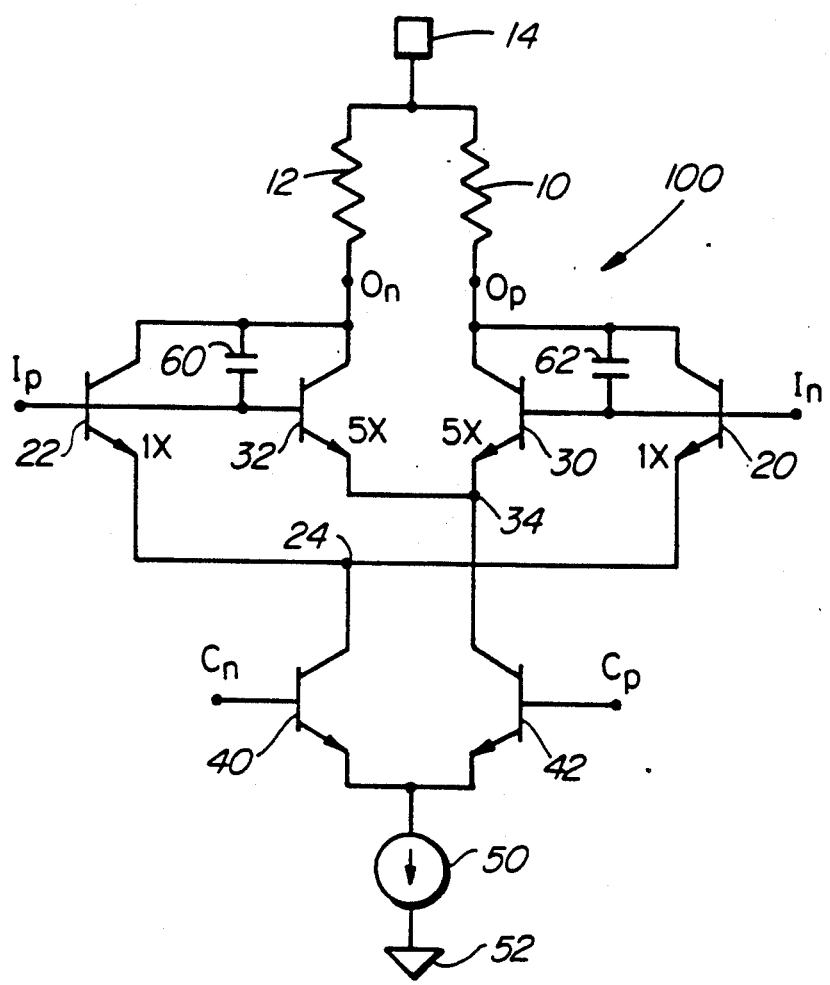
FIG. 1A is a circuit diagram of a differential amplifier according to a first embodiment of the invention.

FIG. 1 is a circuit diagram of a differential amplifier 100. The differential amplifier 100 has a differential input in the form of input terminals $I_p$, $I_n$ and a differential output in the form of output terminals $O_p$, $O_n$. First and second matched load impedances 10, 12 (each approximately 1.5 kOhm) are connected between a 5 volt positive supply 14 and the differential output terminals $O_p$, $O_n$ respectively. A first pair of matched bipolar transistors 20, 22 has collectors connected to the differential output terminals $O_p$, $O_n$ respectively, bases connected to the differential input terminal $I_n$, $I_p$ respectively and emitters connected to a common first node 24. Each of the first pair of transistors 20, 22 has an emitter area approximately 0.8 microns by 4.0 microns. A second pair of matched bipolar transistors 30, 32 has collectors connected to the differential output terminals $O_p$, $O_n$ respectively, bases connected to the differential input terminals $I_n$, $I_p$ respectively and emitters connected to a common second node 34. Each of the second pair of transistors 30, 32 has an emitter area approximately 0.8 microns by 20 microns. A current dividing circuit in the form of a third pair of matched bipolar transistors 40, 42 has collectors connected to the first and second nodes 24, 34 respectively, bases connected to differential control input terminals $C_n$, $C_p$ respectively, and emitters connected to a current source 50. The current source 50 is connected to a 5 volt negative supply 52. A pair of matched capacitors 60, 62 (each approximately 0.1 pF) is connected between the positive differential input terminal $I_p$ and the negative differential output terminal $O_n$ and between the negative differential input terminal $I_n$ and the positive differential output terminal $O_p$ respectively.

Figure 1B:
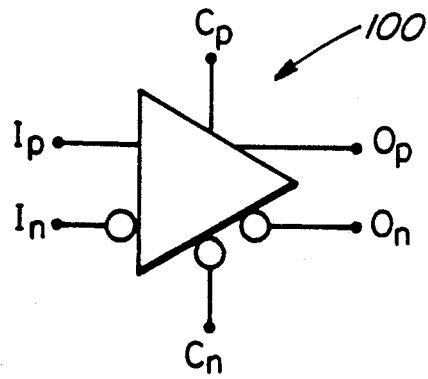
FIG. 1B illustrates a symbol used to denote the differential amplifier of FIG. 1A.

In operation of the differential amplifier 100, the current source 50 supplies a substantially constant bias current which is divided between first and second current paths defined by the third pair of transistors 40, 42 respectively. A control voltage differential applied between the control input terminals $C_n$, $C_p$ controls the division of the bias current between the first differential pair 20, 22 and the second differential pair 30, 32. The first differential pair 20, 22 and the second differential pair 30, 32 each amplify a signal voltage differential applied between the signal input terminals $I_n$, $I_p$ to provide an amplified voltage differential between the signal output terminals $O_n$, $O_p$. FIG. 1B illustrates a symbol used to denote the differential amplifier 100.

Figure 2:
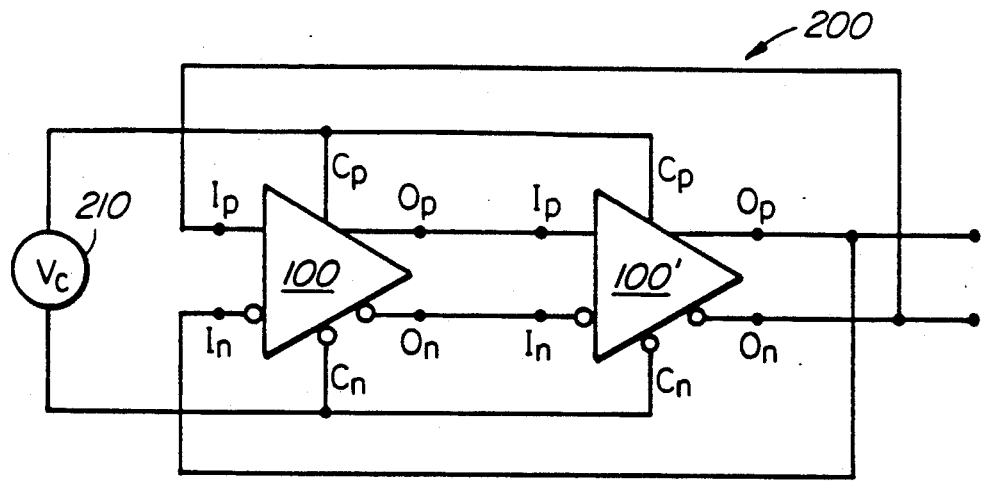
FIG. 2 is a schematic diagram of two differential amplifiers as shown in FIGS. 1A and 1B, connected as a quadrature phase voltage controlled oscillator.

FIG. 2 is a schematic diagram of two differential amplifiers 100, 100', connected as a resonant circuit in the form of a quadrature phase Voltage Controlled Oscillator (VCO) 200. The positive and negative output terminals $O_p$, $O_n$ of differential amplifier 100 are connected to the positive and negative input terminals $I_p$, $I_n$ respectively of differential amplifier 100', and the positive and negative output terminals $O_p$, $O_n$ of differential amplifier 100' are connected to the negative and positive input terminals $I_n$, $I_p$ respectively of differential amplifier 100. The control input terminals $C_n$, $C_p$ of the amplifiers 100, 100' are connected in parallel to an adjustable control voltage source 210. The VCO output is taken from the output terminals $O_p$, $O_n$ of one of the amplifiers 100'.

The VCO 200 oscillates at a frequency where the series gain of the amplifiers 100, 100' is greater than unity and the total phase shift contributed by the amplifiers 100, 100' is 180 degrees, a further 180 degree phase shift resulting from the cross-coupling of the amplifiers 100, 100'. The amplifiers 100, 100' are biased identically, so each contributes a phase shift of 90 degrees at the oscillation frequency.

The oscillation frequency of the VCO 200 is tuned by adjusting the differential voltage $V_c$ applied between the control inputs $C_p$, $C_n$ of the differential amplifiers 100, 100' so as to adjust the division of bias current between the first differential pair 20, 22 and the second differential pair 30, 32 of each amplifier 100, 100'. When most of the bias current is steered to the smaller differential pairs 20, 22, they have a larger differential gain than the larger differential pairs 30, 32, and the frequency response of the smaller transistors 20, 22 dominates the frequency response of the amplifiers 100, 100'. Conversely, when most of the bias current is steered to the larger differential pairs 30, 32, they have a larger differential gain than the smaller differential pairs 20, 22, and the frequency response of the larger transistors 30, 32 dominates the frequency response of the amplifiers 100, 100'.

The frequency responses of the transistors 20, 22, 30, 32 are largely determined by their "Miller capacitance", i.e. the effective capacitive impedance of the transistors between their base and collector terminals. The Miller capacitance at a given frequency increases with the transistor gain at that frequency, and the transistor gain increases with the emitter current density. When most of the bias current is steered to the smaller transistors 20, 22, the emitter current density is relatively high, so the transistor gain and Miller capacitance are relatively high, and the 90 degree phase shift required for oscillation occurs at a relatively low frequency. Conversely, when most of the bias current is steered to the larger transistors, the emitter current density is relatively lower (because the same bias current is applied to transistors having a larger cross-sectional area), so the transistor gain and Miller capacitance are relatively lower, and the 90 degree phase shift required for oscillation occurs at a relatively higher frequency. The base resistance of the smaller transistors 20, 22 is also larger than the base resistance of the larger transistors 30, 32, and this further increases the difference in 90 degree phase shift frequencies for the two differential pairs 20, 22, 30, 32. Consequently, the oscillation frequency can be tuned between two extreme values by controlling the division of bias current between the smaller differential pair 20, 22 and the larger differential pair 30, 32 in each of the amplifiers 100, 100'. The VCO 200 can be tuned from approximately 0.75 GHz to approximately 1.4 GHz with a control bias voltage of approximately 2 volts above ground and control voltage differential from $-0.075$ volts to $+0.075$ volts. This tuning range is more than adequate to compensate for circuit parameter variations resulting from typical manufacturing process variations.

In the VCO 200, the emitter areas of the smaller differential pairs 20, 22 and the larger differential pairs 30, 32, the values of the load impedances 10, 12, and the bias currents are selected so that the gain of each differential amplifier 100, 100' is near unity over the oscillation frequency range. The selected bias current may vary somewhat according to the manufacturing process used, but a total bias current of approximately 0.5 mA is typical for the BiCMOS process in which the VCO 200 was implemented. This restriction on the amplifier gains ensures that the amplitude of oscillations does not force the transistors 20, 22, 30, 32 to cut off so that each amplifier 100, 100' operates in "class A" or linear mode. Consequently, the filtering action of the Miller capacitances and base resistances of the transistors 20, 22, 30, 32 is present throughout the oscillation cycle, and the VCO 200 has a relatively high quality factor (Q). For maximum Q, the loop gain (i.e. the product of the amplifier gains) should be approximately 1.05 (0.5 dB) at the 90 degree phase shift frequency, although a relatively high Q can be achieved for loop gains up to approximately 1.4 (3 dB).

The matched capacitors 60, 62 increase the Miller capacitance of both differential pairs 20, 22, 30, 32 of both amplifiers 100, 100'. The increased Miller capacitance shifts the oscillation frequency range to a lower frequency band. Moreover, by increasing the Miller capacitance and lowering its dependence on nonlinear operating parameters of the amplifier circuit, the matched capacitors 60, 62 further increase the quality factor (Q) of the VCO to between 15 and 50, significantly higher than could be obtained without the capacitors 60, 62.

Figure 3B:
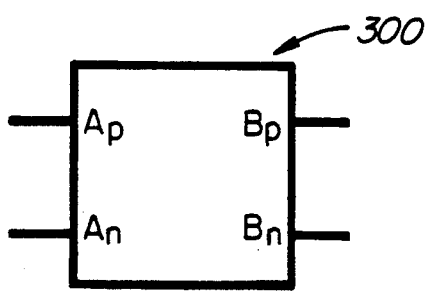
FIG. 3B illustrates a symbol used to denote the two port resonator of FIG. 3A.

FIG. 3A is a schematic diagram of two differential amplifiers 100, 100' connected as a resonant circuit in the form of a differential two port bidirectional resonator 300. The two port bidirectional resonator 300 is essentially the same as the VCO 200 with the addition of terminals $A_p$, $A_n$ connected to the differential outputs $O_p$, $O_n$ of the amplifier 100 defining a first port, and terminals $B_p$, $B_n$ connected to the differential outputs $O_p$, $O_n$ of the amplifier 100' defining a second port which is in quadrature phase with respect to the first port at the resonant frequency. FIG. 3B illustrates a symbol used to denote the resonator 300.

The resonator 300 resonates at a frequency where the phase shift across each amplifier 100, 100' is 90 degrees, so that the total phase shift around the loop is 360 degrees, a 180 degree phase shift resulting from the cross-coupling of amplifier 100' to amplifier 100. If the loop gain is greater than 1, the resonator 300 oscillates at its resonant frequency. If the loop gain is less than 1, the resonator acts as a bandpass filter having a passband centered on its resonant frequency.

Figure 4:
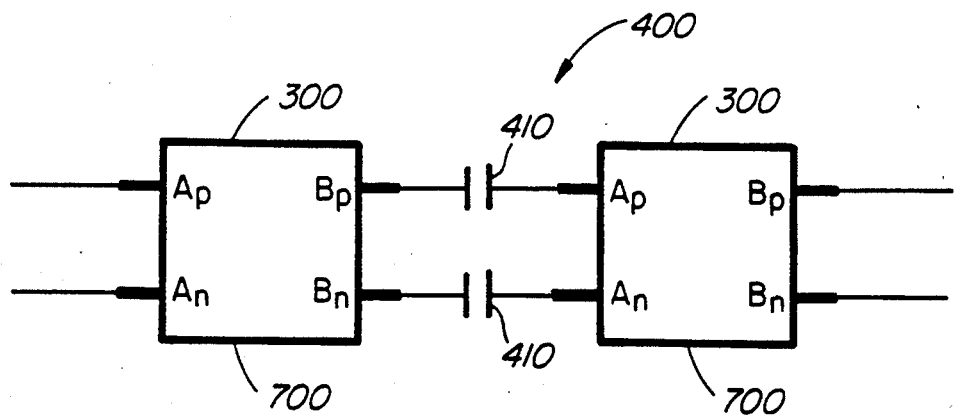
FIG. 4 is a schematic diagram of two resonators as shown in FIGS. 3A and 3B connected as a band pass filter.

Resonators 300 can be used to construct filters and VCOs having higher quality factors (Q) than the VCO 200. FIG. 4 is a block schematic diagram showing a multiple resonator circuit in the form of two resonators 300, 300' connected in series via coupling capacitors 410 to construct a bandpass filter 400. The load impedances 10, 12 of each amplifier 100, 100' of each resonator 300, 300' are selected to ensure that each resonator 300, 300' has a loop gain less than unity at the resonant frequency. The coupling capacitance is selected in accordance with the desired passband characteristics. According to known characteristics of coupled resonators, the filter 400 will have a passband which is flat at the resonant frequency of the individual resonators 300, 300' if the resonators 300, 300' have equal loop gains and the coupling capacitance equals $(C_1 C_2)^{\frac{1}{2}} (Q_1 Q_2)^{-\frac{1}{2}}$, where $C_1$ and $C_2$ are the equivalent capacitances at the ports of the resonators 300, 300', and $Q_1$ and $Q_2$ are the quality factors of the resonators 300, 300'. If the coupling capacitance is less than $(C_1 C_2)^{\frac{1}{2}} (Q_1 Q_2)^{-\frac{1}{2}}$, the filter 400 will have a quality factor (Q) [i which is higher than either of $Q_1$ and $Q_2$. Further series-coupled resonators could be added to further enhance the quality factor (Q) of the filter 400. (See F. E. Terman, Electronic and Radio Engineering. Fourth Edition, McGraw-Hill, 1955, p. 67–73.)

Figure 5:
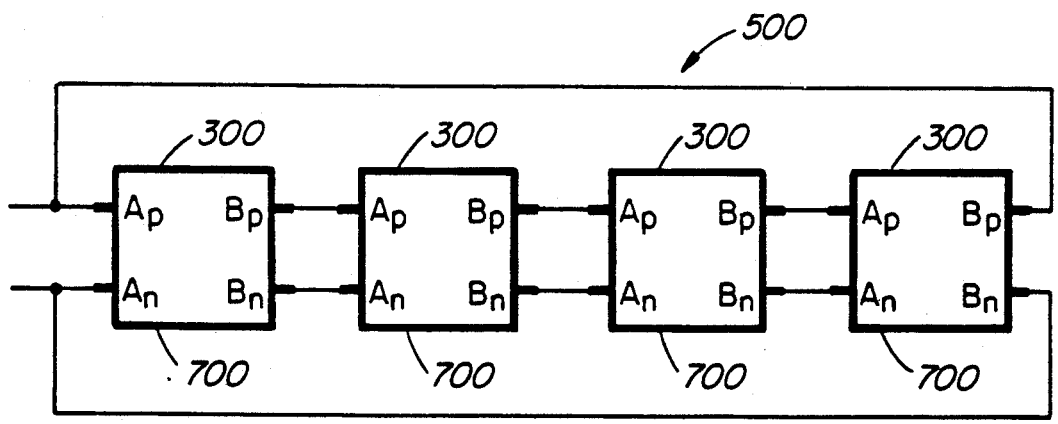
FIG. 5 is a schematic diagram of four resonators as shown in FIGS. 3A and 3B connected in a ring as a four resonator quadrature phase voltage controlled oscillator.

FIG. 5 is a block schematic diagram showing a multiple resonator circuit in the form of four resonators 300 connected in a ring to construct a VCO 500. The load impedances 10, 12 of each amplifier 100, 100' of each resonator 300 are selected to ensure that the ring gain of the VCO is greater than unity at the resonant frequency. The phase shift of each resonator 300 at the resonant frequency is 90 degrees, so that the phase shift around the ring is 360 degrees at resonance, satisfying the phase conditions required for oscillation.

It can be shown that each resonator 300 of the VCO 500 acts as a transformer with a small step up ratio, so the signal power of the individual resonators 300 adds arithmetically around the ring. Conversely, the noise power of the individual resonators 300 can be characterized by independent Gaussian variables which add in RMS fashion around the ring. Consequently, the quality factor (Q) of the VCO 500, which is proportional to the signal power divided by the noise power, should be higher than the quality factor of the individual resonators 300 by a factor of $n^{\frac{1}{2}}=2$ (where n is the number of resonators 300 in the ring) due to power considerations alone.

There is a further increase in quality factor (Q) due to the effect of the ring connection on the bandwidth of the VCO 500. Each resonator 300 in the VCO 500 receives feedback around the ring in addition to internal feedback around its own loop. Because there are four phase shifting amplifiers in the ring feedback path and only two phase shifting amplifiers in the loop feedback path, the VCO 500 will have a narrower 3 dB bandwidth than the individual resonators 300. The ring and loop feedback signals add vectorially to determine the resonance characteristics of the VCO 500. If the ring feedback dominates the loop feedback, it can be shown that the ring connection further enhances the quality factor (Q) of the VCO up to $n^2=16$ times (where n is the number of resonators in the ring), so the total quality factor enhancement can be as high as $n^{5/2}=32$.

Unfortunately, in the VCO 500 the combined loop gain of the resonators 300 making up the VCO 500 exceeds the ring gain, so the loop feedback dominates the ring feedback, and the resonance of each resonator 300 dominates the resonance of the ring. This limits the enhancement of the quality factor (Q) that can be achieved by concatenation of the resonators 300 to a factor of approximately three. This limitation can be overcome by modifying the design of the differential amplifiers 100, 100'.

Such a modified differential amplifier 600 is shown in FIG. 6A. The modified differential amplifier 600 is similar to the differential amplifier 100 except that the load impedances 10, 12 are tapped resistors 60, 62 having positive and negative differential tap output terminals $T_p$, $T_n$ respectively. The tap output terminals $T_p$, $T_n$ provide a differential output signal with a gain from 5% to 25% lower than the gain for differential output signals provided by the output terminals $O_p$, $O_n$. A symbol used to denote the modified differential amplifier 600 is shown in FIG. 6B.

Modified differential amplifiers 600, 600' can be connected as shown in FIG. 7 to construct a resonant circuit in the form of a modified resonator 700. In particular, the input terminals $I_p$, $I_n$ of the first amplifier 600 are cross-coupled to the tap output terminals $T_n$, $T_p$ of the second amplifier 600', and the input terminals $I_p$, $I_n$ of the second amplifier 600' are coupled to the output terminals $O_p$, $O_n$ of the first amplifier 600. Terminals $A_p$, $A_n$ are connected to the input terminals $I_p$, $I_n$ of the second amplifier 600' and terminals $B_p$, $B_n$ are connected to the output terminals $O_p$, $O_n$ of the second amplifier 600' as in the differential two port bidirectional resonator 300.

The loop gain of the modified resonator 700 is the product of the gain of the first amplifier 600 between its input terminals $I_p$, $I_n$ and its output terminals $O_p$, $O_n$ and the somewhat lower gain of the second amplifier 600' between its input terminals $I_p$, $I_n$ and its tap output terminals $T_p$, $T_n$. By suitable location of the tap output terminals $T_p$, $T_n$, the gain of the second amplifier 600' between its input terminals $I_p$, $I_n$ and its tap output terminals $T_p$, $T_n$ can be made less than unity to set the loop gain very close to unity, thereby maximizing the quality factor (Q) of the resonator 700.

The gain from terminals $A_p$, $A_n$ to terminals $B_p$, $B_n$ of the resonator 700 is the full gain of the amplifiers 600, 600', whereas the gain from terminals $B_p$, $B_n$ to terminals $A_p$, $A_n$ is the lower gain provided at the tap output terminals $T_p$, $T_n$ of the amplifiers 600, 600'. Consequently the resonator 700 is a two port bidirectional resonator having unequal gains in opposite directions.

Output signals taken from the tap output terminals $T_p$, $T_n$ are in phase with output signals taken from the output terminals $O_p$, $O_n$. The modified resonator 700 resonates at the frequency for which there is a 90 degree phase shift across each of the amplifiers 600, 600'. Signals at the ports $A_p$, $A_n$ and $B_p$, $B_n$ have a quadrature phase relationship at resonance.

When the resonators 300 of the multiple resonator VCO 500 of FIG. 5 are replaced by modified resonators 700 as described above, the loop gain of each resonator 700 is lower, but the ring gain of the multiple resonator circuit is substantially unchanged. Consequently, the ring gain of the multiple resonator circuit now exceeds the combined loop gain of the resonators 700 and much higher quality factors (Q) closer to the theoretical values can be obtained.

As noted above, the quality factor (Q) can be maximized by setting the combined loop gain of the amplifiers 600, 600' near unity by connecting to the tap outputs $T_n$, $T_p$ of the second amplifier 600' in each resonator 700. In most conventional ring oscillator designs, setting the loop gains near unity jeopardizes reliable oscillation since greater than unity gain is required for oscillator start up. However, because the ring gain can be maintained significantly higher than unity while setting the loop gains of each resonator 700 near unity in this design, high quality factors (Q) can be obtained without jeopardizing reliable oscillation.

The amplifier gains can drift due to temperature variations, and this can jeopardize quality factor (Q) enhancement. To compensate for such effects, the multiple resonator VCO 500 using modified resonators 700 may further comprise a current source controller in the form of a circuit 800 as shown in FIG. 8 for controlling the bias current provided by each current source 50 of each differential amplifier 600. The current source control circuit 800 comprises two bipolar transistors 81, 82 and a load resistor 83 which are coupled to the current sources 50 (implemented here as further bipolar transistors) in a standard current mirror configuration so that the current supplied by each current source 50 matches the collector current of transistor 81. The current source control circuit 800 further comprises a third bipolar transistor 85 which is connected to an input network comprising resistors 86, 87 and a coupling capacitor 88, and an output network comprising a decoupling capacitor 89. One of the resistors 86 is larger than the other resistor 87 so that DC base voltage of the third transistor 85 is less than half the base voltage of the second transistor 82, and the third transistor 85 is therefore DC-biased in its offstate.

An amplified output of the multiple resonator VCO 500 is coupled to the base of the third transistor 85 via the coupling capacitor 88. If the VCO output is sufficiently large, the third transistor 85 begins to turn on, stealing base current from the first and second transistors 81, 82 and consequently reducing the current supplied by each of current sources 50 to reduce the loop gain of each resonator 700 of the multiple resonator VCO 500. The ratio of the resistances 86, 87 is selected so that the third transistor 85 turns on when the VCO output corresponds to a loop gain greater than unity in each resonator 700. Consequently, the current source controller circuit 800 sets the loop gain of each resonator 700 near unity for optimum quality factor enhancement. This automatic gain control also stabilizes the output amplitude of the multiple resonator VCO 500 at an amplitude defined by the ratio of resistance 86 to resistance 87. A decoupling capacitor 89 is connected across the third transistor 85 to ensure that it responds to long term drift of the VCO output amplitude and not to short term noise in the control circuit 800. Because the temperature coefficient at the collector of the third transistor 85 is matched to the temperature coefficient at the base of the second transistor 82, the temperature coefficient of the VCO output peak detection is very low, typically 0.2% per degree Celsius.

The embodiments as described above may be modified without departing from the inventive concept. For example, the third transistor 85 together with its input and output networks can be replicated for each quadrature output of the multiresonator VCO 500 to increase the efficiency of the current control circuit 800.

A resonator circuit having the benefits of the resonator circuit 700 could be constructed with one amplifier 100 having untapped load resistors and another amplifier 600' having tapped load resistors. The amplifier 600 may be replaced with the amplifier 100 because the tap outputs $T_p$, $T_n$ of the amplifier 600 are left floating in the resonator 700.

A resonator circuit having the benefits of the resonator circuit 700 could also be built with two amplifiers, each of which has only a single pair of output terminals, provided that the two amplifiers each provide a 90 degree phase shift at substantially the same frequency and have different gains at that frequency. For example, the normal output terminals $O_p$, $O_n$ of the second amplifier 600' in the resonator 700 could be eliminated, and the second port $B_p$, $B_n$ could be connected to the tap output terminals $T_p$, $T_n$ of the second amplifier instead of the normal output terminals $O_p$, $O_n$.

In the multiple resonator circuits 400, 500, different numbers of resonators 300, 700 may be provided to provide different filter or VCO characteristics. It can be shown that the effective quality factor $(Q_n)$ of a multiple resonator oscillator circuit 500 made up of n resonators 700 can be between $n^2$ and $n^{5/2}$ times the quality factor (Q) of each resonator 700 so long as the tap ratio is suitably selected and n is less than about Q/2. If the tap ratio is made too large, the individual resonators 700 depart from the ideal quadrature phase shift due to the unbalanced bidirectional gains between the two ports. The ring resonance then departs from the resonance of the individual resonators 700, and the filtering effect of the resonators 700 is reduced at the ring oscillation frequency. In fact, for n greater than 4, if the ring gain is large enough it is possible for the ring to oscillate at a frequency satisfying only the requirement that the total phase shift around the ring is 360 degrees. In a practical 16 resonator ring VCO where each resonator 700 had a tap ratio of 0.25, it was necessary to short circuit four adjacent resonators to create a ring of four resonators 700 within a ring of 16 resonators in order to make the ring oscillate at the resonant frequency of the resonators 700. The ring of four resonators provided additional filtering which discriminated against lower, unwanted frequencies. Other multiple ring arrangements are also possible.

For oscillation of multiple resonator circuits comprising resonators connected in one or more rings, each ring should comprise an integer multiple of four resonators. Alternatively, each ring may comprise an odd integer multiple of two resonators provided that one of the resonators is cross-coupled to an adjacent resonator to provide an additional 180 degree phase shift as required to meet the phase shift requirements for oscillation. An example of an oscillator comprising three pairs of resonators 300 with appropriate cross-coupling is shown in FIG. 9.

These and other modifications are within the scope of the invention as defined by the following claims.

I claim:
1. A differential amplifier, comprising:
   a current source for supplying a substantially constant bias current;
   a current dividing circuit for controllably dividing the substantially constant bias current between first and second current paths;
   a pair of matched load impedances;
   a first pair of matched transistors connected as a differential pair between the matched load impedances and the first current path, each transistor of the first pair having a first emitter area; and
   a second pair of matched transistors connected as a differential pair between the matched load impedances and the second current path with differential inputs of the second differential pair connected to corresponding differential inputs of the first differential pair, each transistor of the second pair having a second emitter area different from the first area.

2. A differential amplifier as defined in claim 1, further comprising a pair of matched capacitors, each capacitor connected between a respective differential input and a respective differential output of the differential amplifier.

3. A differential amplifier as defined in claim 1, wherein the first emitter area is approximately five times the second emitter area.

4. A differential amplifier as defined in claim 1, wherein the current dividing circuit comprises first and second transistors connected in the first and second current paths respectively, division of current between the first and second current paths being controllable in response to a voltage difference applied between the first and second transistors.

5. A differential amplifier as defined in claim 1, wherein the load impedances are tapped to provide tap outputs having a lower differential gain.

6. A resonant circuit comprising first and second differential amplifiers as defined in claim 1, a positive input of the second differential amplifier being connected to a positive output of the first differential amplifier, a negative input of the second differential amplifier being connected to a negative output of the first differential amplifier, a positive input of the first differential amplifier being connected to a negative output of the second differential amplifier, and a negative input of the first differential amplifier being connected to a positive output of the second differential amplifier.

7. A resonant circuit as defined in claim 6, having a loop gain greater than unity for operation as an oscillator.

8. A resonant circuit as defined in claim 6, having a loop gain less than unity for use in a tuned filter.

9. A multiple resonator circuit, comprising a plurality of resonant circuits as defined in claim 6 connected in series, each resonant circuit having a loop gain less than unity for operation of the multiple resonator circuit as part of a tuned filter.

10. A multiple resonator circuit, comprising an even number of resonant circuits as defined in claim 6 connected in a ring, the multiple resonator circuit having a ring gain greater than unity and a 90 degree phase shift across each resonant circuit at a particular frequency for oscillation at that frequency.

11. A multiple resonator circuit as defined in claim 10, comprising an integer multiple of four resonant circuits connected in a ring.

12. A multiple resonator circuit as defined in claim 10, comprising an odd integer multiple of two resonant circuits connected in a ring, one of the resonant circuits being cross-coupled to an adjacent resonant circuit in the ring.

13. A differential amplifier, comprising:
first and second matched load impedances connected between a voltage supply and first and second output terminals respectively;
a first pair of matched bipolar transistors, each having a first emitter area, a first transistor of the first pair having a collector connected to the first output terminal, a base connected to a first input terminal and an emitter connected to a first node, and a second transistor of the first pair having a collector connected to the second output terminal, a base connected to a second input terminal and an emitter connected to the first node;
a second pair of matched bipolar transistors, each having a second emitter area different from the first emitter area, a first transistor of the second pair having a collector connected to the first output terminal, a base connected to the first input terminal and an emitter connected to a second node, and a second transistor of the second pair having a collector connected to the second output terminal, a base connected to the second input terminal and an emitter connected to the second node;
a third pair of matched bipolar transistors, a first transistor of the third pair having a collector connected to the first node, a base connected to a first control input and an emitter connected to a third node, and a second transistor of the third pair having a collector connected to the second node, a base connected to a second control input and an emitter connected to the third node; and
a current source for supplying a substantially constant current at the third node, said current being divided between the first and second transistors of the third pair according to a voltage applied between the first and second control inputs.

14. A differential amplifier as defined in claim 13, further comprising:
a first capacitor connected between the first output terminal and the first input terminal; and
a second capacitor connected between the second output terminal and the second input terminal, the second capacitor being matched to the first capacitor.

15. A differential amplifier as defined in claim 14, wherein the first and second matched load impedances comprise a pair of tapped resistors having first and second tap outputs respectively.

* * * * *